(12) United States Patent
Lee et al.

(10) Patent No.: US 7,012,288 B2
(45) Date of Patent: Mar. 14, 2006

(54) HETEROJUNCTION BIPOLAR TRANSISTOR HAVING NON-UNIFORMLY DOPED COLLECTOR FOR IMPROVED SAFE-OPERATING AREA

(75) Inventors: Chien Ping Lee, Fremont, CA (US); Hin Fai Chau, Fremont, CA (US); Nanlei Larry Wang, Palo Alto, CA (US); Clarence John Dunnrowicz, Santa Cruz, CA (US); Yan Chen, Fremont, CA (US); Barry Jia-Fu Lin, Cupertino, CA (US)

(73) Assignee: WJ Communications, Inc., San Jose, CA (US)

( * ) Notice: Subject to any disclaimer, the term of this patent is extended or adjusted under 35 U.S.C. 154(b) by 74 days.

(21) Appl. No.: 10/267,215

(22) Filed: Oct. 8, 2002

(65) Prior Publication Data
US 2004/0065897 A1   Apr. 8, 2004

(51) Int. Cl.
*H01L 31/0336* (2006.01)

(52) U.S. Cl. .................................... 257/197; 257/198

(58) Field of Classification Search ............. 257/197, 257/198, 183, 200, 565, 312; 438/312, 317, 438/372

See application file for complete search history.

(56) References Cited

U.S. PATENT DOCUMENTS

| | | | | |
|---|---|---|---|---|
| 4,951,115 A | * | 8/1990 | Harame et al. | ............. 257/191 |
| 5,198,682 A | * | 3/1993 | Wu et al. | ...................... 257/21 |
| 6,531,721 B1 | * | 3/2003 | Burton et al. | ................ 257/197 |

OTHER PUBLICATIONS

S. Wolf, "Silicon Processing for the VLSI Era, vol. 2—Process Integration," Lattice Press, Sunset Beach, CA (1990), pp. 467-468.*

Fullowan et al., "*Improved Breakdown of AlInAs/InGaAs Heterojunction Bipolar Transistors*", Electronics Letters, vol. 27, pp. 2340-2341, Dec. 1991.

Hassan et al., "*Control of Current-Mode Second Breakdown in Transistors Through Use of Double-Graded Collectors*", Solid-State Electronics, vol. 33, No. 10, pp. 1217-1221, 1990.

Pfost et al., "*Optimization of the Collector Profile of InGaP/ GaAs HBTs for Increased Robustness*", 25th IEEE GaAsIC Symposium, Nov. 9-12, pp. 115-118, 2003.

* cited by examiner

*Primary Examiner*—Douglas W. Owens
(74) *Attorney, Agent, or Firm*—Beyer Weaver & Thomas LLP

(57) ABSTRACT

The safe-operating area (SOA) in a heterojunction bipolar transistor (HBT) is improved by providing a collector region in the transistor having a graded (uniformly or stepped) doping between the base region and the underlying subcollector region with the collector doping being lower near the base and higher near the subcollector and with the collector doping being less than the doping of the subcollector. The non-uniformly doped collector reduces Kirk effect induced breakdown when collector current increases.

4 Claims, 2 Drawing Sheets

HETEROJUNCTION BIPOLAR TRANSISTOR HAVING NON-UNIFORMLY DOPED COLLECTOR FOR IMPROVED SAFE-OPERATING AREA

BACKGROUND OF THE INVENTION

This invention relates generally to heterojunction bipolar transistors (HBT), and more particularly the invention relates to improving the safe-operating area (SOA) of such a transistor.

Heterojunction bipolar transistors (e.g. III–V compound semiconductor) are used in amplifier circuits for telecommunications applications. A major concern lies in operating the transistors in safe-operating areas (SOA) to prevent overdrive and failure of the devices. As shown in FIG. 1, the SOA is defined by two boundaries. The first boundary, SOA Boundary I, is limited by the open-emitter base-collector junction breakdown voltage, BVcbo of the transistor. This boundary sets the operating limit of the transistor at low current densities. The second boundary, SOA Boundary II, is related to the collector breakdown when substantial injected current carriers are present in the collector. This boundary is important at medium to high current levels. If one attempts to operate a HBT beyond the SOA boundaries in the non-safe operating areas as shown in the figure, the device will catastrophically fail. The conventional way to increase the collector breakdown voltage is to increase the thickness and to decrease the doping concentration of the collector. Using the approach conventional HBT's have been produced with a BVcbo of around 70 volts by using a collector with a thickness of 3 $\mu$m and a dopant concentration of 6e 15 cm$^{-3}$. However, although a larger BVcbo moves SOA Boundary I to a higher Vce, the SOA Boundary II does not necessarily move to a higher collector current, Ic. In fact, breakdown always happens at a voltage smaller than BVcbo when there is large current flowing through the transistor. This is a result of the Kirk effect.

The Kirk effect results when the collector current increases to a high enough level and the number of injected electrons compensates the space charge in the collector and changes the electric field distribution. The effect happens when the effective injected charge density exceeds the background doping concentration in the collector, and the space charge changes sign and the location of the high field region moves from the base-collector junction to the collector-subcollector junction. The breakdown then is no longer controlled by the doping density in the collector alone, but also by the collector current. As Ic increases, the effective negative space charge density increases, and this causes the electric field to increase at the collector-subcollector junction, and results in a reduction of breakdown voltage. Further, decreasing of the collector doping will only improve the low current breakdown voltage but will not improve the medium and high current breakdown voltage.

BRIEF SUMMARY OF THE INVENTION

The standard heterojunction bipolar transistor has a uniformly doped collector. In accordance with the present invention, the collector of a heterojunction bipolar transistor has a non-uniform doping with the doping near the base region being more lightly doped than the subcollector side of the collector. The doping profile can have two or more distinctly doped layers or a continuous grading of the collector doping.

The invention and objects and features thereof will be more readily apparent from the following detailed description and appended claims when taken with the drawings.

DETAILED DESCRIPTION OF THE INVENTION

Figure 1:
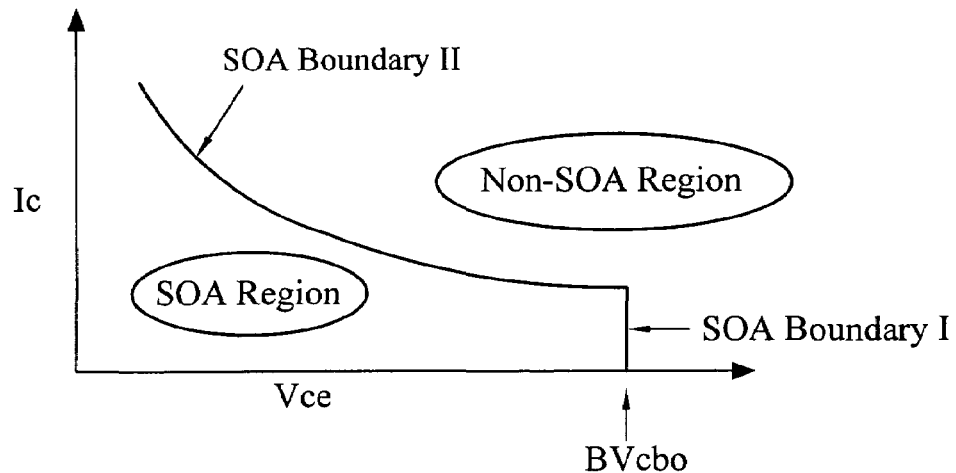
FIG. 1 is a graph of collector current, Ic, versus collector-emitter voltage, Vce, for a HBT which illustrates safe operation boundaries.
Figure 2:
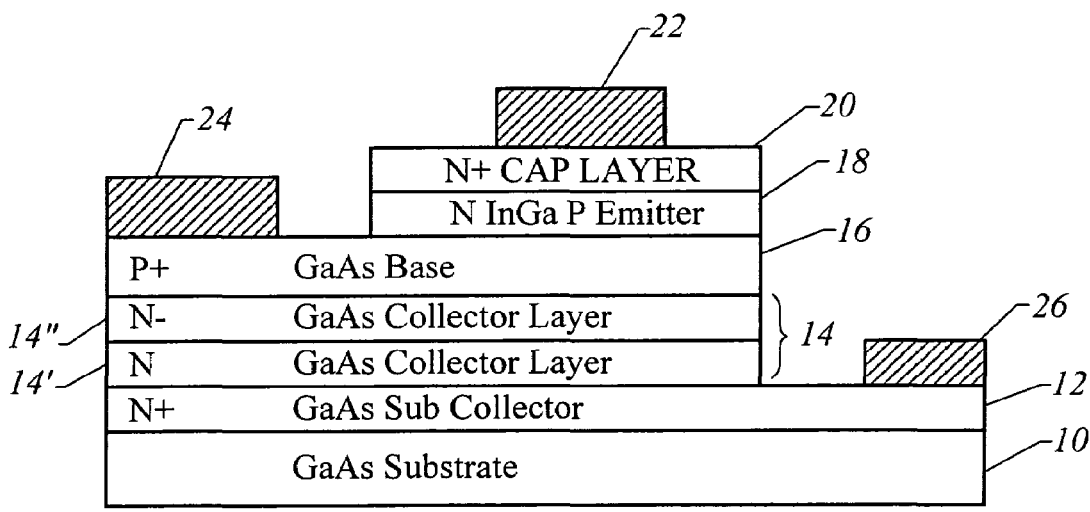
FIG. 2 is a section view of a HBT which is modified in accordance with an embodiment of the invention.

FIG. 2 is a section view of a heterojunction bipolar transistor which is modified in accordance with one embodiment of the invention. The transistor comprises a GaAs substrate 10 on which is formed an N$^+$ doped GaAs subcollector region 12 and a N doped GaAs collector 14 which includes an N doped layer 14' and N$^-$ doped layer 14" which abuts a P$^+$ GaAs base 16. An N doped InGaAs emitter 18 is formed on base 16 with an N$^+$ cap layer 20 formed on emitter 18. Cap layer 20 can comprise an N$^+$ doped GaAs layer with an N$^+$ InGaAs layer thereon. Contacts 22, 24, and 26 are formed on the emitter, base, and collector, respectively.

Since the Kirk effect induced breakdown happens near the collector-subcollector junction, the provision of non-uniform doping as illustrated in FIG. 2 with increased doping concentration in the collector near the subcollector layer will mitigate the effect. However, to have an optimum design, one has to be careful not to make the more heavily doped collector layer too thick or use a doping concentration close to that in the heavily doped subcollector layer. Otherwise, BVcbo and therefore the SOA boundary I will suffer.

Table I illustrates four collector structures and the respective calculated breakdown voltage. Collectors made of GaAs are assumed in the calculation. The standard structure has a uniformly doped collector, which one would normally use to have a high breakdown voltage. The other three collector structures, A, B, and C, all have non-uniform collector doping profiles, and each has a more heavily doped layer inserted in the subcollector side of the collector layer. The differences among the three structures, A, B, and C, are in the thickness of the low and high doped layers and the doping concentration in the high doped layer. All four structures have the same total collector thickness of 3 $\mu$m. The same emitter size of 24 $\mu$m$^2$ is used in the calculation. A constant breakdown field is assumed, and when the electric field reaches its value, the device fails because the collector breakdown and the SOA boundaries are closely related to each other. The BVcbo decrease when a more heavily doped layer is included in the collector near the subcollector region. However, if the layer is kept thin relative to the total collector thickness, and its doping level remains low relative to the subcollector doping which is typically on the order of 10$^{18}$ ions cm$^{-3}$, the decrease in BVcbo is minimal since a large portion of the collector close to the base remains at low doping level. The breakdown induced by the Kirk effect, however, changes drastically with changes in the collector structure. At Ic=10 mA, for example, one can see that the breakdown voltage can be increased by more than a factor of two if a proper structure is used.

TABLE 1

| | Standard Structure | Structure A | Structure B | Structure C |
|---|---|---|---|---|
| Collector Structure | 3.0 μm, 7e15 cm$^{-3}$ | 2.5 μm, 7e15 cm$^{-3}$ + 0.5 μm, 2e16 cm$^{-3}$ | 2.5 μm, 7e15 cm$^{-3}$ + 0.5 μm, 4e16 cm$^{-3}$ | 2.0 μm, 7e15 cm$^{-3}$ + 1.0 μm, 4e16 cm$^{-3}$ |
| BVcbo | 80 V | 78 V | 75.6 V | 67 V |
| BV at 10 mA | 21.5 V | 29.5 V | 42.7 V | 62.7 V |

BV = Breakdown Voltage

Figure 3:
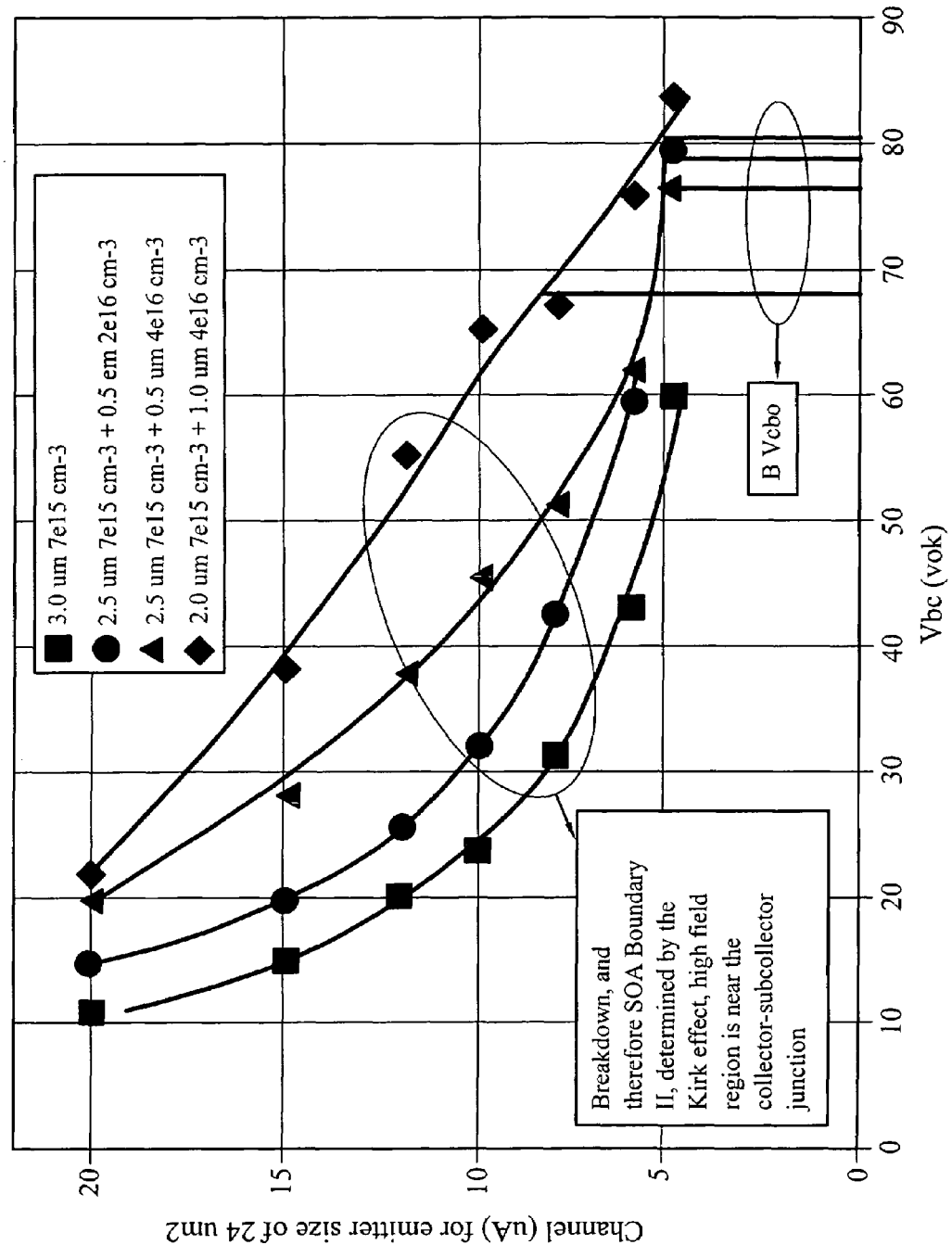
FIG. 3 illustrates SOA boundaries in plots of Ic versus Vbc for a transistor with a standard uniformly doped collector and for three transistors with non-uniform doping in accordance with the invention.

FIG. 3 shows the SOA (breakdown voltage as a function of IC) of the four devices. A great improvement in SOA Boundary II is obtained by using the invention illustrated in these embodiments. An added advantage for these structures is the reduced on resistance when the devices are in saturation because of the higher doping in the collector region near the subcollector layer.

While a two-step, low high collector doping profile is used in these embodiments, other embodiments can realize the non-uniform collector doping profile for the improvement of SOA Boundary II. For example, one can use multiple layers in the collector instead of two doping layers. The layer with the lowest doping concentration is near the base, and that with the highest doping concentration is near the subcollector which has the highest doping level.

Alternatively, a continuous grading in the collector doping profile can be used to improve SOA Boundary II. The key is to have the more heavily doped collector region near the subcollector layer and the more lightly doped region near the base, and the heaviest doping concentration in the collector layer remains lower than that in the subcollector layer.

The invention can be applied to all heterojunction bipolar transistors, including for example, AlGaAs/GaAs, InGaP/GaAs, InP/InGaAs, InAlAs/InGaAs, and InAlGaAs/InGaAs single and double heterojunction bipolar transistors with GaAs, InGaAs, InP, AlGaAs, InGaP, InAlAs, or a combination thereof as the collector material. The invention can be also applied to Si based bipolar transistors including Si/SiGe heterojunction bipolar transistors.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A heterojunction bipolar transistor (HBT) comprising:
   a) an emitter region of one conductivity type,
   b) a base region of opposite conductivity type abutting the emitter region,
   c) a collector region of the one conductivity type abutting the base region, and
   d) a subcollector region of the one conductivity type abutting the collector region, the collector region having a doping profile with continuous dopant grading from the base region to the subcollector region with lightest doping near the base region and heaviest doping near the subcollector region, the heaviest doping being less than the doping in the subcollector region.

2. The HBT as defined by claim 1 wherein the collector doping concentration varies from about 7e15 ions cm$^{-3}$ to about 2e16 ions cm$^{-3}$ and the subcollector is on the order of 5e18 ions cm$^{-3}$.

3. The HBT as defined by claim 1 wherein the collector doping varies from 7e15 ions cm$^{-3}$ to 4e16 ions cm$^{-3}$ and the subcollector doping is on the order of 5e18 ions cm$^{-3}$.

4. The HBT as defined by claim 1 wherein the one conductivity type is N type and the opposite conductivity is P type.

* * * * *